United States Patent [19]
Yuan

[11] Patent Number: 5,855,957
[45] Date of Patent: Jan. 5, 1999

[54] OPTIMIZATION OF SIO₂ FILM CONFORMALITY IN ATMOSPHERIC PRESSURE CHEMICAL VAPOR DEPOSITION

[75] Inventor: Zheng Yuan, Cupertino, Calif.

[73] Assignee: Watkins-Johnson Company, Palo Alto, Calif.

[21] Appl. No.: 801,997

[22] Filed: Feb. 18, 1997

[51] Int. Cl.⁶ .................................................. C23C 16/00
[52] U.S. Cl. ................................... 427/255.3; 427/255.2; 427/255.1; 427/255.5
[58] Field of Search ............................ 427/255.3, 255.2, 427/255.5, 248.1, 255.1, 579

[56] References Cited

U.S. PATENT DOCUMENTS

| | | | |
|---|---|---|---|
| 5,136,975 | 8/1992 | Bartholomew et al. | 118/715 |
| 5,290,736 | 3/1994 | Sato et al. | 437/238 |
| 5,304,398 | 4/1994 | Krusell et al. | 427/255.3 |
| 5,462,899 | 10/1995 | Ikeda | 437/238 |
| 5,545,436 | 8/1996 | Saito | 427/255.3 |

FOREIGN PATENT DOCUMENTS 0697376  2/1996  European Pat. Off. .

Primary Examiner—Roy V. King
Attorney, Agent, or Firm—Flehr Hohbach Test Albritton & Herbert LLP

[57] ABSTRACT

A chemical vapor deposition apparatus and method for forming an oxide thin film on a surface of a substrate. The system includes a reaction chamber having a support for holding a substrate and an injector positioned to inject gaseous substances into the reaction chamber. The injector includes a central injection port coupled to a source of ozone and at least two outer injection ports positioned on opposite sides of the central injection port and coupled to a source of chemical reagent. Ozone and chemical reagent are separately injected into the reaction chamber through the central injection port and outer injection ports, respectively, with the ozone and chemical mixing in the area between the injector and the substrate.

10 Claims, 4 Drawing Sheets

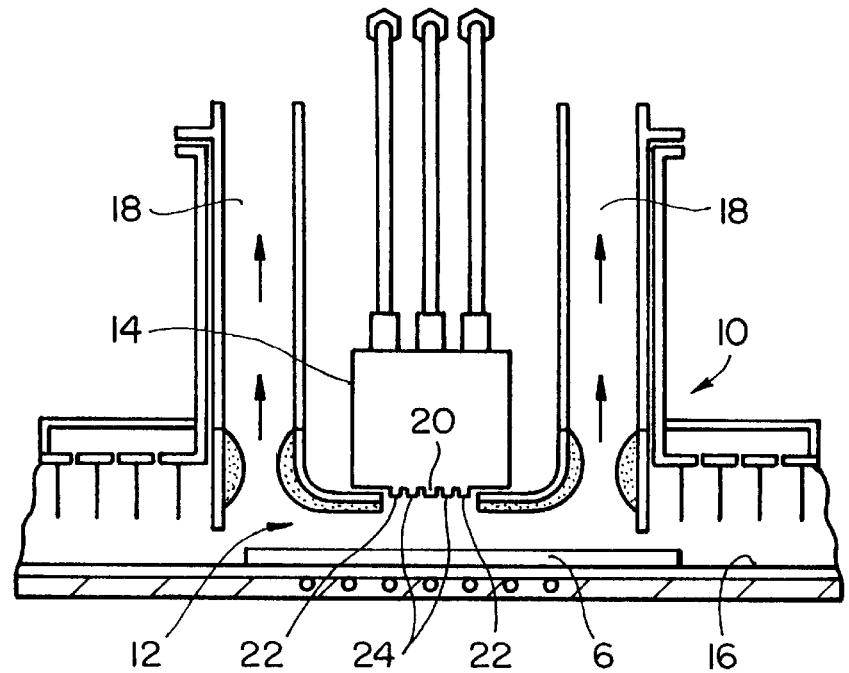
FIG_1
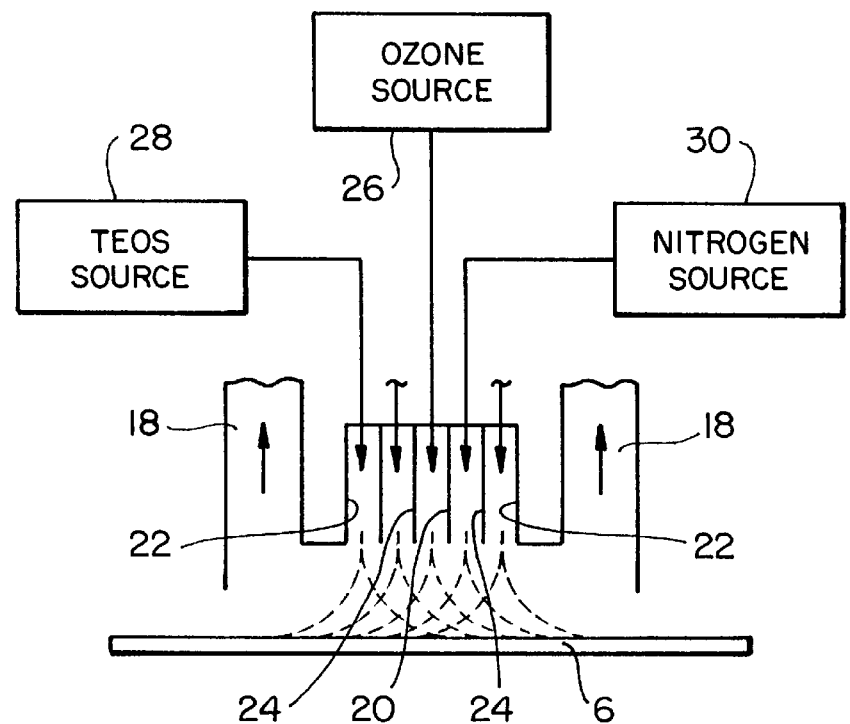
FIG_2

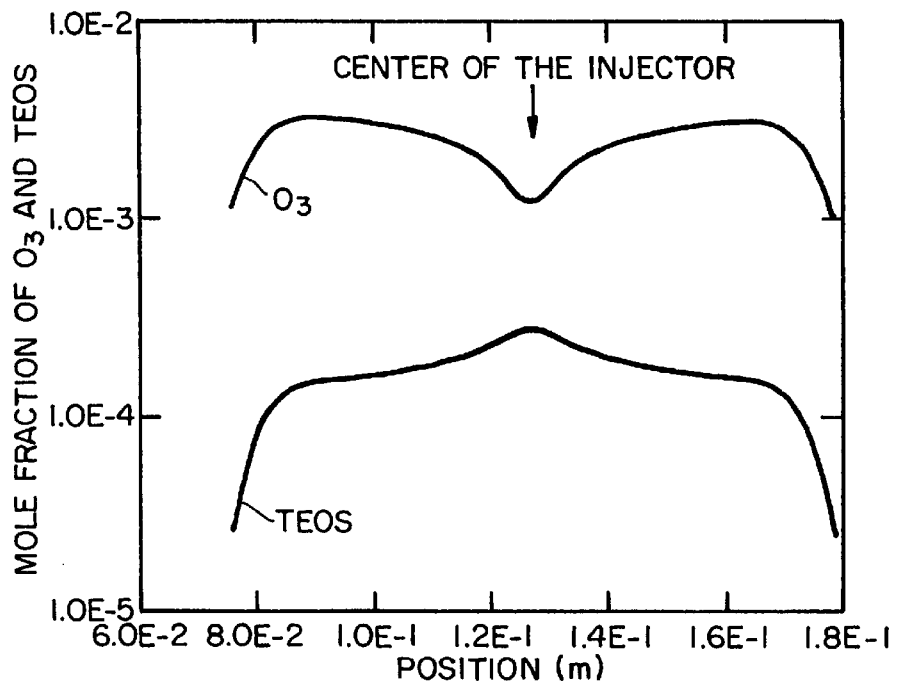
FIG_3
*(PRIOR ART)*
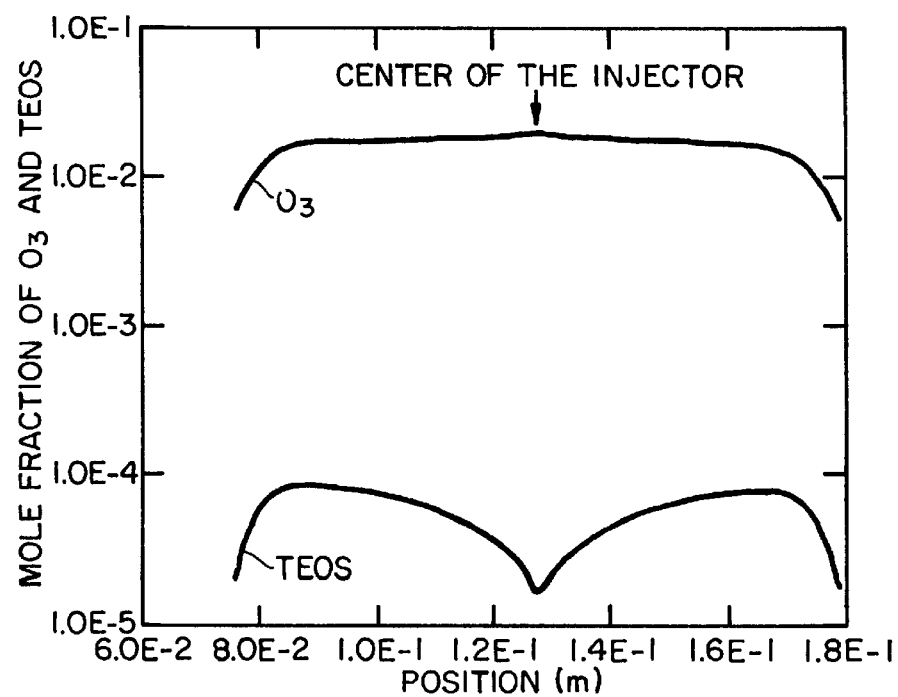
FIG_4

OPTIMIZATION OF SIO₂ FILM CONFORMALITY IN ATMOSPHERIC PRESSURE CHEMICAL VAPOR DEPOSITION

BRIEF DESCRIPTION OF THE INVENTION

The present invention relates in general to the formation of thin $SiO_2$ films by atmospheric pressure chemical vapor deposition and, more particularly, to the optimization of conformality of the deposited $SiO_2$ films.

BACKGROUND OF THE INVENTION

Atmospheric pressure chemical vapor deposition (APCVD) systems are used to form thin, uniform layers or films on a substrate such as a semiconductor wafer. During APCVD processing, silicon dioxide films may be formed by mixing chemical vapors such as tetraethoxysilane (TEOS) with ozone. As the gases are mixed, the resulting chemical reactions deposit a silicon dioxide film on the substrate surface. The desired reactions generally occur in the temperature range of 300° C. to 500° C., with the substrate and chamber being heated to the selected temperature. For semiconductor processing, film characteristics such as moisture content, resistance to cracking, density and the like must meet high quality standards. Another important characteristic is step coverage; that is, the formation of a film of uniform thickness overlying and following the shape of components on the surface of the substrate such as aluminum connection wires and the like. The ability of the deposited film to fill gaps of about 0.18 to 0.25 micron between adjacent surface components is another important factor affecting the quality of the film and integrated circuits formed on the wafer. Obtaining high quality films is becoming of greater significance as the number of layers formed on the substrate increases and integrated circuits become more intricate.

One method employed in APCVD processing is to mix the chemical reactants before they are injected into the reaction chamber to expose the substrate to a more uniform mixture during processing. However, the reaction of the mixed chemicals in the injectors, conduits and the like may result in powder formation which reduces the efficiency of the injector and provides a source of particulate contamination reducing the purity of the deposited film.

With other APCVD processes, the reactants, such as TEOS and ozone, are separately injected into the reaction chamber. With prior art systems, the central port of the injector is typically coupled to the source of TEOS or other chemical reagent while an oxygen/ozone mixture is supplied to two outer ports. Two streams of nitrogen or another inert gas separate the TEOS and ozone to insure that the chemicals are mixed directly above the substrate in the reaction chamber. For a reagent-centered injection configuration, flow-like step coverage of the deposited film is only observed outside of the area immediately below the center port. Thus, the surface conformality in the area of the ozone injectors is typically greater than the area immediately beneath the central TEOS port.

U.S. Pat. No. 5,462,899 discloses a chemical vapor deposition method for forming $SiO_2$ films in which TEOS is combined with an oxygen/ozone mixture having an ozone concentration of only 0.1 to 1 percent ozone by volume and the mixture is injected into the reaction chamber. A mixture of oxygen/ozone having a higher ozone concentration of 1 to 10 percent ozone is separately injected into the reaction chamber. The TEOS-oxygen/ozone mixture is injected through several ports including the central port.

An APCVD system which optimizes uniformity of the deposited film, providing flow-like step coverage across the entire substrate including the region immediately below the center port, is desirable. An APCVD system in which the deposited film has reduced shrinkage, wet etch ratios, and moisture absorption is also desirable.

OBJECTS AND SUMMARY OF THE INVENTION

It is a primary object of the present invention to provide an APCVD system for depositing a thin film on a surface of a substrate such as a semiconductor wafer.

It is a further object of the present invention to provide an APCVD system for depositing a film exhibiting improved conformality.

It is another object of the present invention to provide an apparatus and method for depositing a film on a substrate where the film provides substantially uniform step coverage across the substrate.

It is yet another object of the present invention to provide an APCVD deposition system for depositing a film exhibiting reduced shrinkage, wet etch ratios, and moisture absorption.

A more general object of the present invention is to provide a method and apparatus for efficiently and consisting forming a uniform, high quality, thin film on the surface of a substrate.

In summary, this invention provides an APCVD system for depositing a thin film on a surface of a substrate. The system includes an APCVD apparatus having a reaction chamber with a support for holding a substrate and an injector positioned to inject gaseous substances into the reaction chamber. The injector includes a central injection port and at least two outer injection ports positioned on opposite sides of the central injection port. The central injection port is coupled to a source of ozone and the outer injection ports are coupled to a source of chemical reagent, for example TEOS, such that the central injection port and the outer injection ports separately inject the ozone and chemical reagent, respectively, into the reaction chamber with the ozone and chemical reagent mixing in the area between the injector and the substrate.

The system of the invention also includes the method of providing a reaction chamber with an injector having at least two outer injection ports and a central injection port positioned between the outer injection ports, and positioning a substrate in the reaction chamber opposite the outer injection ports and the central injection ports. The method further includes the steps of coupling the central injection port to a source of ozone, coupling the outer injection ports to a source of chemical reagent, and separately injecting ozone through the central injection port and the chemical reagent through the outer injection ports so that the ozone and chemical reagent mix in the reaction chamber between the substrate and the injector to deposit a uniform film across the substrate surface.

Additional objects and features of the invention will be more readily apparent from the following detailed description and appended claims when taken in conjunction with the drawings.

BRIEF DESCRIPTION OF THE DRAWINGS

FIG. 1 is a schematic view of a chemical vapor deposition system in accordance with this invention.

FIG. 2 is a schematic view of the system of the injector of FIG. 1, shown with a wafer positioned opposite the injector.

FIG. 3 is a graph showing the simulated TEOS and ozone species distributions above the layer for a TEOS centered injector configuration.

FIG. 4 is a graph showing the simulated TEOS and ozone species distributions above the layer for the system of the present invention.

DETAILED DESCRIPTION OF THE INVENTION

Figure 5A:
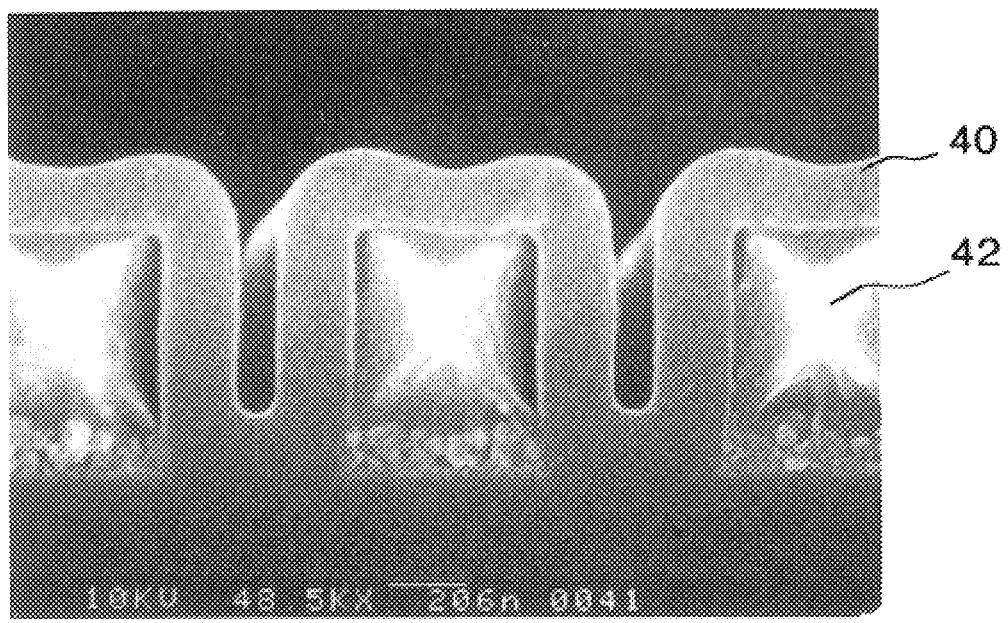
FIGS. 5A and 5B are cross-sectional micrographs of a thin film deposited on a substrate using the injector of FIG. 1 with the substrate retained in a stationary position during deposition.

Reference will now be made in detail to the preferred embodiment of the invention, which is illustrated in the accompanying figures. Turning now to the drawings, wherein like components are designated by like reference numerals throughout the various figures, attention is directed to FIG. 1

An APCVD system 10 for depositing a film on the surface of a wafer or other substrate 6 is shown in FIG. 1. The APCVD system includes a reaction chamber, generally designated 12, having a linear injector 14. With this embodiment, the reaction chamber 12 is of the type where the wafer 6 is moved through the chamber 12 by a conveyor 16. The conveyor 16 may be moved continuously during operation of the injector 14 or, if desired, the operation of the conveyor may be interrupted while the gases are injected above a stationery wafer 6. Although not shown, the reaction chamber may also be of the type where the wafer 6 is retained on a stationary support. As is described in more detail below, the process gases are injected into the area above the wafer 6, where the gases mix to form a thin film on the wafer surface. By-products of the reaction and unreacted gases are removed from the chamber 12 through exhaust ports 18 positioned on either side of the injector 14. The exhaust and nitrogen purges (not shown) isolate the deposition region of the reaction chamber from the ambient atmosphere. As is known in the art, the reaction chamber 12 includes heaters (not shown) for heating the reaction chamber and wafer 6 to a temperature of about 350° C. to 450° C. during processing.

The injection system of this invention is shown schematically in FIG. 2. The injector 14 generally includes a central injection port 20, two outer injection ports 22, and separation ports 24 positioned between the central port 20 and each of the outer ports 22. In accordance with this invention, the central injection port 20 is coupled to an ozone source 26, the outer ports 22 are coupled to a chemical reagent source 28, and the separation ports 24 are coupled to a source 30 of an inert gas such as nitrogen to prevent premature mixing of the reagent and ozone which could lead to powder formation. In a preferred embodiment of the invention, the chemical reagent is tetraethoxysilane (TEOS), although other reagents may be used instead of TEOS including, but not limited to, hexainethyldisiloxane [HMDSO, $(CH_3)_3SiOSi(CH_3)_3$], hexamethyldisilazane [HMDS, $((CH_3)_3Si)_2NH$], octamethylcyclotetrasiloxane [OMCTS, $_3$ $_2((CH_4)$ $SiO)$], and 2,4,6,8-tetramethylcyclotetrasiloxane [TMCTS, $((CH_3)HSiO)_4$], substances of the general formula $SiH_x(OR)_{4-x}$ where "R" is an alkyl group or its oligomers and x=0, 1, 2, or 3, and other chemicals such as boron, phosphorus, fluorine containing sources and combinations thereof In the illustrated embodiment, the TEOS vapor is delivered to the outer ports 22 from a bubbler at 65° C. by nitrogen carrier gas. However, other means may be used to deliver the chemical reagent to the outer ports 22 as is known in the art.

Ozone is injected through the central port 20 at a flow rate of about 2 to 10 standard liter per minute (slm). The ozone is preferably supplied in a mixture of ozone and oxygen having an ozone concentration of about 70 to 150 g/m³ ozone. The chemical reagent or TEOS is supplied at a flow rate of 10 to 50 standard cubic centimeters per minute (sccm), and injected through the outer ports with a Nitrogen carrier gas at a flow rate of about 0.5 to 8 slm. The ratio of ozone to TEOS introduced into the chamber is in the range of 10:1 to 30:1. The injected gases mix and react to deposit a film on the surface of the wafer 6.

FIGS. 3 and 4 represent the projected distribution of TEOS and ozone in the reaction chamber 12 without considering the chemical reactions occurring in the chamber for a prior art injection configuration (FIG. 3) and the injection configuration of this invention (FIG. 4). The conditions for the simulation generating the data are as follows. The reactant gases enter the chamber at a temperature of 75° C. and the inlet gas velocities for central port 20, separation ports 24 and outer ports 22 are 0.556, 0.203 and 0.191 m/sec, respectively. The other imposed boundary conditions are: specified species molar concentrations at injector inlets; no-slip condition on all solid surfaces; gray-body radiation from the wafer surface to the chamber ceiling shield ($\epsilon_{wafer}$=0.32), gray-body radiation from the shield surface to atmosphere ($\epsilon_{wall}$=0.65), with adiabatic wall conditions everywhere else. At the exhausts, zero diffusion flux boundary condition is applied. The computational mesh consists of 29,000 unevenly distributed grid cells. The Reynolds number based on chamber height and maximum gas inlet velocity is found to be 600. Therefore, calculations assume laminar flow conditions inside the chamber.

As is shown in FIGS. 3 and 4, the gas species distribution above the boundary layer depends primarily on the injection port configuration. FIG. 3, the TEOS-centered injection configuration known in the art, shows that the flow ratios in the area directly below the central port 20 and the areas toward the exhaust ports 18 are about 12:1 and 40:1, respectively, when the input ratio of ozone to TEOS is about 32:1. With the injection system of this invention, a high ozone concentration covers the entire deposition area above the boundary layer while the TEOS concentration is high in the adjacent areas toward each side of the chamber 12. The ozone to TEOS molar fraction ratios in the area below the central port 20 and the areas toward exhaust are about 900:1 and 190:1, respectively, while the input ozone to TEOS ratio is only about 24:1. According to the simulated model, the change of the gas flow configuration dramatically increases the ozone to TEOS ratio 75 times in the central region of the deposition area.

Figure 5B:
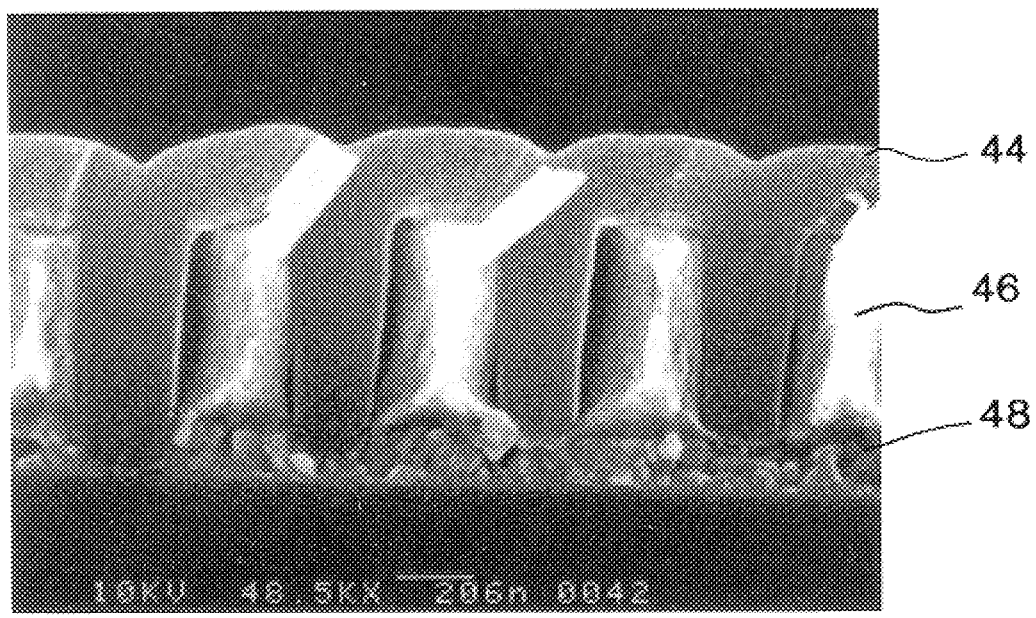

FIGS. 5A and 5B show examples of the $SiO_2$ films deposited on the patterned wafers using the injection configuration of this invention. FIG. 5A illustrates in cross section the central area of a wafer which was retained at a stationary position during processing. The processed wafer 6 includes a layer of a $SiO_2$ film 40 which has been deposited on components 42 formed on the wafer. In the illustrated example, the components 42 comprise a Ti/Al/TIN structure having a spacing of about 0.25 $\mu m$. This uniform coverage is significantly different from films formed using a TEOS centered injection configuration, where the similar flow like step coverage only occurred at about 2 cm away from the center of the deposition zone in a Gaussan deposition profile. FIG. 5B shows in cross section an example of a film 44 deposited on a wafer having a plurality of aluminum lines 46 separated by a spaces 48 of about 0.2 μm, providing an aspect ratio of about 3:1. The spaces 48 have been filled without observable voids or seams.

Figure 6A:
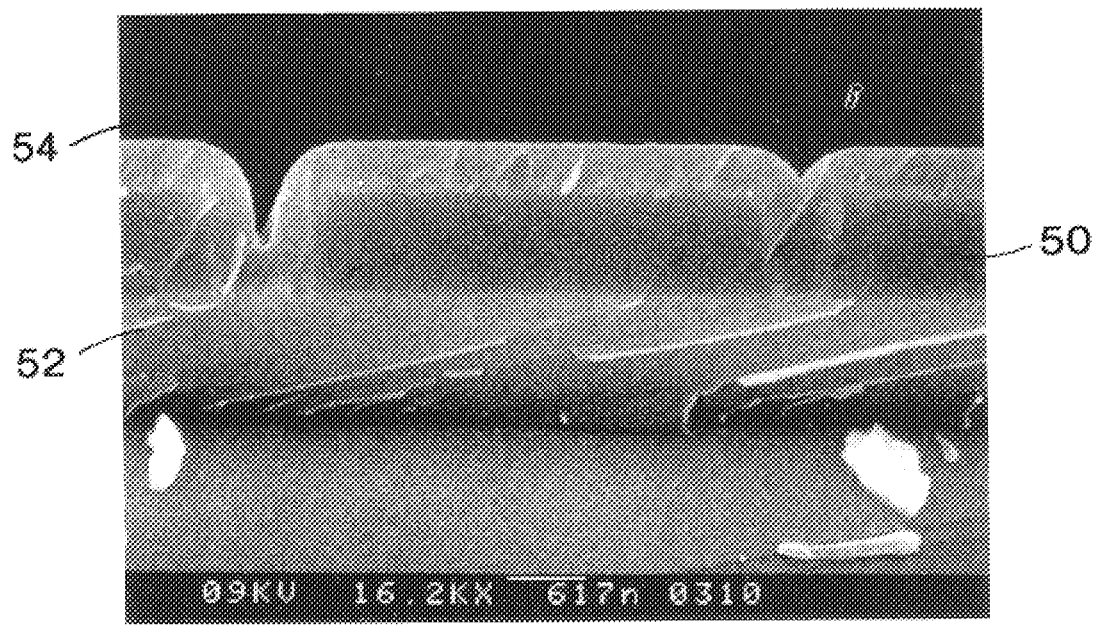
FIGS. 6A and 6B are cross-sectional micrographs of a thin film deposited on a substrate using the injector of FIG. 1 with the substrate moved through the reaction chamber during deposition.
Figure 6B:
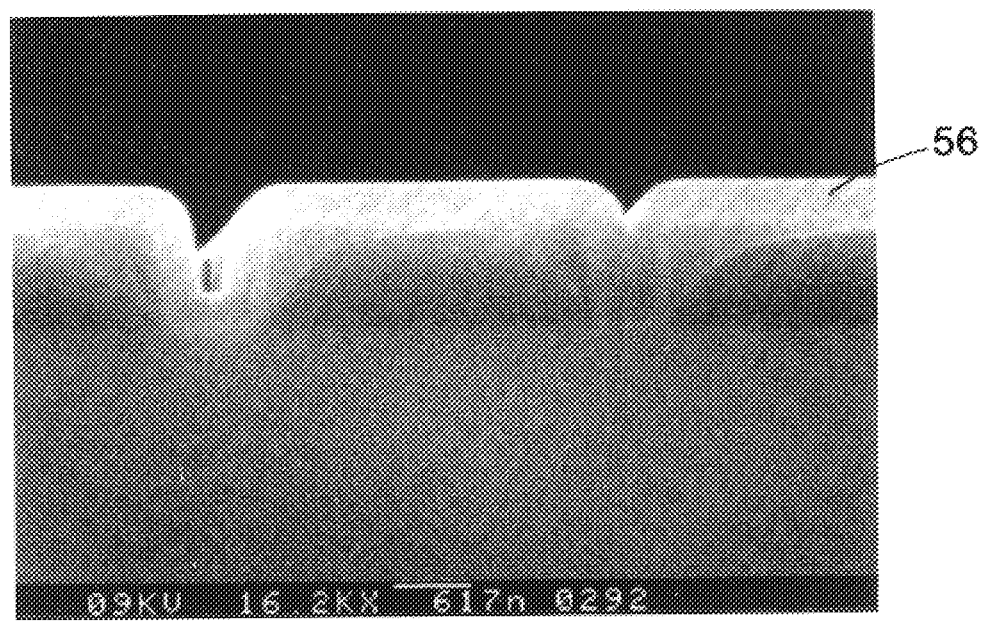

FIGS. 6A and 6B show examples of wafers which were moved through the reaction chamber 12 by the conveyor 16 during processing. The substrate 6 is a patterned thermal oxide overcoated with a thin layer of PolySi 50 formed with Ti/Al/TiN structures 50. The structures 50 are separated by a 0.35 μm spacing 52 with a 1.5:1 aspect ratio. As is shown in FIG. 6A, a film 54 exhibiting flow-like step coverage and excellent gap filling was obtained using the injection configuration of this invention and a deposition temperature of 425° C. The processed wafer shown in FIG. 6A is comparable to the wafer shown in FIG. 5A which was held in a stationary position during processing. FIG. 6B shows a wafer processed under the same conditions as the wafer of FIG. 6A except that the deposition temperature is 400° C. The resulting film 56 exhibits conformal step coverage. On the Ti/Al/TiN structured wafers, spaces of about 0.25 μm between adjacent structures and an aspect ratio of about 2.5:1 can be filled without the formation of voids at deposition temperatures from 375° to 425° C.

As is apparent from the forgoing, the APCVD system of this invention may be used to form a film having flow-like step coverage directly under the central injection port 20 as well as the other areas of the wafer. Films deposited using the injection configuration of this invention exhibit excellent gap-filling capability for quarter micron device applications.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A method of forming a thin oxide film on a surface of a substrate comprising the steps of:

providing a reaction chamber with an injector having at least two outer injection ports, a central injection port between said outer injection ports, and at least two separation ports between said outer injection ports and said central injection port, and a deposition area below said outer injection ports, said central injection port and said separation ports;

positioning said substrate in said reaction chamber opposite said outer injection ports and said central injection ports; and coupling said central injection port to a source of ozone;

coupling said outer injection ports to a source of an organosilicon precursor chemical reagent;

coupling said separation ports to a source of an inert gas;

injecting ozone through said central injection port to supply ozone to said reaction chamber in a substantially uniform concentration across said deposition area, and during said step of injecting ozone, separately injecting said inert gas through said separation ports and said chemical reagent through said outer injection ports so that the substantially uniform concentration of said ozone mixes with said chemical reagent in said reaction chamber between the substrate and said injector to deposit a substantially uniform film on the surface of the substrate.

2. The method of claim 1 in which said step of coupling said outer injection ports to a source of an organosilicon precursor chemical reagent includes coupling said outer injection ports to a source of tetraethoxysilane.

3. The method of claim 2 in which said step of coupling said outer injection ports to a source of tetraethoxysilane includes diluting the tetraethoxysilane with an inert gas.

4. The method of claim 1 in which said step of coupling said outer injection ports to a source of an organosilicon precursor chemical reagent includes coupling said outer injection ports to a source of a reagent selected from the group consisting of hexamethyldisiloxane (HMDSO), hexamethyldisilazane (HMDS), octamethylcyclotetrasiloxane (OMCTS), and 2,4,6,8tetramethylcyclotetrasiloxane (TMCTS), and substances of the general formula $SiH_x(OR)_{4-x}$ where "R" is an alkyl group or its oligomers and x=0, 1, 2, or 3 and combinations thereof.

5. The method of claim 1 in which said step of injecting said ozone through said central injection port includes injecting said ozone at a flow rate of 2 to 10 slim.

6. The method of claim 1 in which said step of separately injecting said chemical reagent through said outer injection ports includes injecting said chemical reagent at a flow rate of 10 to 50 sccm.

7. The method of claim 1 in which said steps of injecting said ozone through said central injection port and separately injecting said chemical reagent through said outer injection ports include injecting said ozone and said chemical reagent when said substrate is positioned with a center region of said substrate substantially aligned with said central injection port.

8. The method of claim 1 in which said step of coupling said separation ports to a source of an inert gas includes coupling said separation ports to a source of nitrogen.

9. The method of claim 1 in which said step of injecting inert gas through said separation ports includes injecting said inert gas at a flow rate of 0.5 to 8 slm.

10. The method of claim 1, and further comprising the step of moving said substrate through said reaction chamber on a conveyor.

* * * * *